(12) United States Patent
Sung et al.

(10) Patent No.: US 9,543,511 B2
(45) Date of Patent: Jan. 10, 2017

(54) RRAM DEVICE

(71) Applicant: Taiwan Semiconductor Manufacturing Co., Ltd., Hsin-Chu (TW)

(72) Inventors: Fu-Ting Sung, Yangmei (TW); Chang-Ming Wu, New Taipei (TW); Hsia-Wei Chen, Taipei (TW); Shih-Chang Liu, Alian Township (TW); Wen-Ting Chu, Kaohsiung (TW); Yu-Wen Liao, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/645,878

(22) Filed: Mar. 12, 2015

(65) Prior Publication Data

US 2016/0268505 A1    Sep. 15, 2016

(51) Int. Cl.
*H01L 45/00* (2006.01)
*H01L 27/24* (2006.01)

(52) U.S. Cl.
CPC ....... *H01L 45/1233* (2013.01); *H01L 27/2436* (2013.01); *H01L 45/1253* (2013.01);
(Continued)

(58) Field of Classification Search
CPC .. H01L 45/1233; H01L 45/146; H01L 45/147; H01L 45/1608; H01L 45/1253; H01L 45/1675; H01L 21/8229; H01L 27/2436
(Continued)

(56) References Cited

U.S. PATENT DOCUMENTS

| 7,936,027 B2* | 5/2011 | Xiao | H01L 43/12 257/421 |
| 8,491,799 B2* | 7/2013 | Jung | G11C 11/16 216/100 |

(Continued)

OTHER PUBLICATIONS

Limcharoen, et al. "Characterisation of C—F Polymer Film Formation on the Air-Bearing Surface Etched Sidewall of Fluorine-Based Plasma Interacting with AL2O3—TiC Substrate." Hindawi Publishing Corporation Journal of Nanomaterials vol. 2013, Article ID 851489, 6 pages http://dx.doi.org/10.1155/2013/851489. May 28, 2013.

(Continued)

*Primary Examiner* — Christine Enad
(74) *Attorney, Agent, or Firm* — Eschweiler & Associates, LLC

(57) ABSTRACT

The present disclosure relates to an integrated circuits device having a RRAM cell, and an associated method of formation. In some embodiments, the integrated circuit device has a lower metal interconnect layer surrounded by a lower ILD layer and a bottom electrode disposed over the lower metal interconnect layer. The bottom electrode has a lower portion surrounded by a bottom dielectric layer and an upper portion wider than the lower portion. The bottom dielectric layer is disposed over the lower metal interconnect layer and the lower ILD layer. The integrated circuit device also has a RRAM dielectric with a variable resistance located on the bottom electrode, and a top electrode located over the RRAM dielectric. The integrated circuit device also has a top dielectric layer located over the bottom dielectric layer abutting sidewalls of the upper portion of the bottom electrode, the RRAM dielectric, and the top electrode.

20 Claims, 8 Drawing Sheets

(52) U.S. Cl.
CPC .......... *H01L 45/146* (2013.01); *H01L 45/147* (2013.01); *H01L 45/1608* (2013.01); *H01L 45/1675* (2013.01)

(58) Field of Classification Search
USPC .......................................................... 257/4
See application file for complete search history.

(56) References Cited

U.S. PATENT DOCUMENTS

| | | | | |
|---|---|---|---|---|
| 9,142,762 | B1* | 9/2015 | Li | H01L 43/12 |
| 2001/0041416 | A1* | 11/2001 | Torii | H01L 28/55 |
| | | | | 438/396 |
| 2006/0054950 | A1* | 3/2006 | Baek | H01L 27/112 |
| | | | | 257/295 |
| 2009/0159563 | A1* | 6/2009 | Jung | H01L 43/12 |
| | | | | 216/22 |
| 2012/0135543 | A1* | 5/2012 | Shin | H01L 43/12 |
| | | | | 438/3 |
| 2013/0032775 | A1* | 2/2013 | Satoh | H01L 45/04 |
| | | | | 257/1 |
| 2013/0037961 | A1* | 2/2013 | Lee | H01L 21/76897 |
| | | | | 257/774 |
| 2013/0248797 | A1* | 9/2013 | Sandhu | H01L 45/04 |
| | | | | 257/2 |
| 2014/0217490 | A1* | 8/2014 | Seo | H01L 21/28273 |
| | | | | 257/319 |
| 2014/0264222 | A1* | 9/2014 | Yang | H01L 29/66659 |
| | | | | 257/2 |
| 2014/0308758 | A1* | 10/2014 | Nemani | H01L 43/12 |
| | | | | 438/3 |
| 2015/0262864 | A1* | 9/2015 | Okamoto | H01L 21/31116 |
| | | | | 438/671 |

OTHER PUBLICATIONS

Kim, et al. "Characteristics of the Post-Etch Polymer Residues Formed at the Via Hole and Polymer Removal Using a Semi-Aqueous Stripper." Journal of the Korean Physical Society, vol. 49, No. 5, Nov. 2006, pp. 1991-1997. Nov. 2006.

Cui. "Microfabrication and thin film technology—Chapter 10 Etching." Mar. 19, 2010.

* cited by examiner

RRAM DEVICE

BACKGROUND

Many modern electronic devices contain electronic memory configured to store data. Electronic memory may be volatile memory or non-volatile memory. Volatile memory stores data only while it is powered, while non-volatile memory is able to keep data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
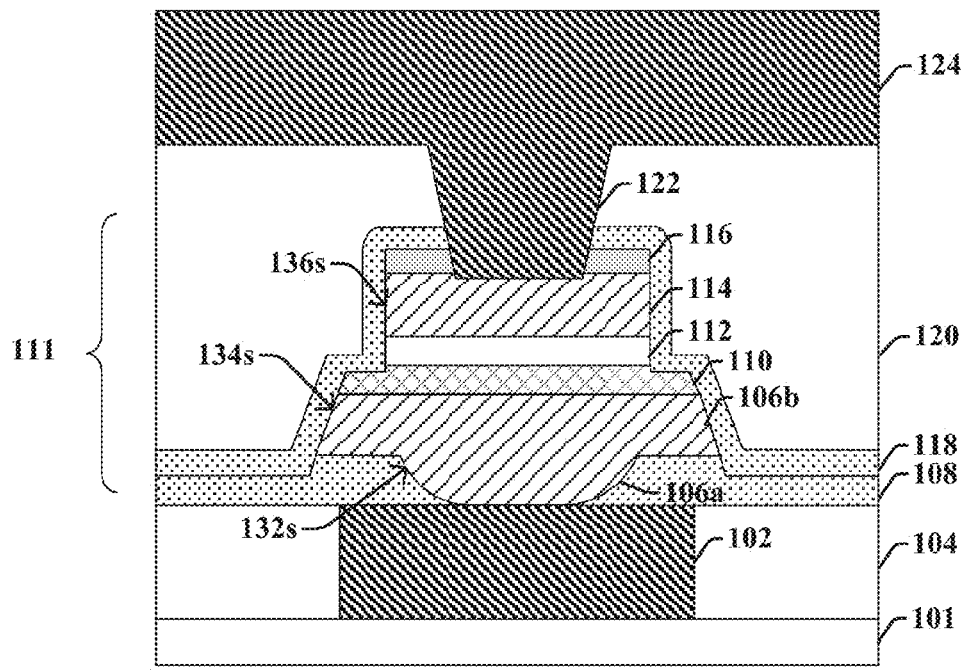
FIG. 1 illustrates a cross-sectional view of some embodiments of an integrated circuit device including a resistive random access memory (RRAM) cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells include a dielectric data storage layer placed between two electrodes. Depending on voltages applied to the electrodes, the dielectric data storage layer will undergo a reversible change between a high resistance state associated with a first data state (e.g., a '0' or 'RESET') and a low resistance state associated with a second data state (e.g., a '1' or 'SET'). Once a resistance state is set, a RRAM cell will retain the resistive state until anther voltage is applied to induce a RESET operation (resulting in a high resistance state) or a SET operation (resulting in a low resistance state).

RRAM cells are typically formed by a process in which a sidewall spacer is formed surrounding a top electrode after patterning of the top electrode. The sidewall spacer acts as a mask for subsequent patterning of the dielectric data storage layer and underlying bottom electrode. The sidewall spacer can be formed by depositing a continuous dielectric liner followed by an etch process to remove lateral portions and leave the sidewall spacer along sidewall of the top electrode. Then, the bottom electrode is patterned by vertically removing excess conductive material not covered by the top electrode and the sidewall spacer.

As scaling continues to reduce the size of RRAM cells, the bit-to-bit pitch becomes narrower and causes a smaller space between adjacent RRAM cells. The smaller space between adjacent RRAM cells makes forming sidewall spacers more difficult (e.g., sidewall spacers may merge in a narrow trench between adjacent RRAM cells). Since the sidewall spacers provide for an isolation distance that is sufficient to provide for electrical isolation between the top and bottom electrodes, processing problems in forming the sidewall spacers can potentially increase leakage between the top and bottom electrodes of an RRAM cell and thereby downgrade the performance of the RRAM cell.

Accordingly, the present disclosure relates to an improved RRAM device and an associated method of formation. In some embodiments, the RRAM device comprises a RRAM cell having a stack of a top electrode and a bottom electrode separated by a RRAM dielectric having a variable resistance. The bottom electrode comprises a lower portion surrounded by a bottom dielectric layer and an upper portion that is wider than the lower portion. In some embodiments, instead of depositing a continuous dielectric line to form a sidewall spacer, a polymer material is accumulated along sidewalls of the top electrode during a series of in-situ etching processes of the stack. Thus, the processing problems associated with sidewall spacer formation are eliminated. The polymer material is removed after being used to pattern the upper portion of the bottom electrode, and a top dielectric layer is then formed over the bottom dielectric layer, to abut sidewalls of the upper portion of the bottom electrode, the RRAM dielectric, and the top electrode.

FIG. 1 illustrates a cross-sectional view of an integrated circuit device 100 including a RRAM cell 111 according to some embodiments.

The integrated circuit device 100 comprises a lower metal interconnect layer 102 surrounded by a lower inter-level dielectric (ILD) layer 104 and an upper metal interconnect layer 124 abutting an upper ILD layer 120 disposed over a substrate 101. In some embodiments, the lower ILD layer 104 and the upper ILD layer 120 may comprise silicon dioxide ($SiO_2$), a low-k dielectric material, or extreme low-k (ELK) dielectric material. The RRAM cell 111 is disposed between the lower metal interconnect layer 102 and an upper metal via 122 abutting the upper metal interconnect layer 124 and comprises a bottom electrode 106 and a top electrode 114 separated by a RRAM dielectric 110. The RRAM dielectric 110 comprises a material having a variable resistance configured to undergo a reversible phase change between a high resistance state and a low resistance. For example, the RRAM dielectric 110 may include a transitional metal oxide comprising one or more layers of hafnium oxide ($HfO_3$), aluminum oxide ($AlO_x$) tantalum oxide ($TaO_x$), or other composite combinations such as hafnium aluminum oxide (HfAlO).

In some embodiments, a capping layer 112 can be disposed between the RRAM dielectric 110 and the top electrode 114. The capping layer 112 has a lower concentration of oxygen than the RRAM dielectric 110, and is configured to extract oxygen from the RRAM dielectric 110 to facilitate resistance changes within the RRAM dielectric 110. In various embodiments, the capping layer 112 may comprise Ti, Hafnium (Hf), Platinum (Pt), Ruthenium (Ru) or other composite metal films. A hard mask 116 can be disposed on the top electrode 114. The hard mask 116 has sidewalls aligned with sidewalls of the top electrode 114. In some embodiments, sidewalls of the capping layer 112 can also be aligned with the sidewalls of the top electrode 114 and the hard mask 116. In some embodiments, the hard mask 116 may comprise silicon oxy-nitride (SiON), silicon dioxide ($SiO_2$), silicon carbide (SiC), silicon-nitride ($SiN_x$), or other composite dielectric films.

The bottom electrode 106 may comprises a lower portion 106a and an upper portion 106b. In some embodiments, the lower portion 106a abuts the lower metal interconnect layer 102 and is surrounded by a bottom dielectric layer 108. The lower portion 106a and the upper portion 106b may have tapered sidewalls 134s, 136s with independent tilt angles. The lower portion 106a may tilt outwardly and upper portion 106b may tilt inwardly. In some embodiments, the lower portion 106a has a smaller lateral dimension than the upper portion 106b. The upper portion 106b may have a trapezoid shape with a minimum lateral dimension greater than a lateral dimension of the top electrode 114 having a cuboid shape.

A top dielectric layer 118 is disposed over the bottom dielectric layer 108. The top dielectric layer 118 continuously extends along sidewalls of the upper portion 106b of the bottom electrode and the RRAM dielectric 110, and overlies a top surface of the RRAM dielectric 110 not covered by the top electrode 114. The top dielectric layer 118 also extends along a sidewall of the top electrode 114 and overlies a top surface of the top electrode 114. In some embodiments, the top dielectric layer 118 can be a conformal layer that abuts the bottom dielectric layer 108 and sidewalls of the bottom electrode 106, the RRAM dielectric 110, the capping layer 112, the top electrode 114, and the hard mask 116. The top dielectric layer 118 separates the top electrode 114 and the RRAM dielectric 110 from the upper ILD layer 120 surrounding the upper metal interconnect layer 124 and an upper metal via 122. The upper metal via 122 is disposed through a hole within the top dielectric layer 118 and is connected to the top electrode 114. In some embodiments, the bottom dielectric layer 108 and the top dielectric layer 118 may respectively comprise a same dielectric material or different dielectric materials such as silicon carbide (SiC), silicon nitride ($SiN_x$), or one or more layers of composite dielectric films.

By forming the top dielectric layer 118 as a conformal layer extending between sidewalls of the top electrode 114 and the bottom electrode 106, isolation is achieved between the top electrode 114 and the bottom electrode 106 without the use of sidewall spacers. By providing electrical isolation without the use of sidewall spacers the footprint of the RRAM cell 111 can be reduced, thereby enabling continued scaling in emerging technology nodes.

Figure 2A:
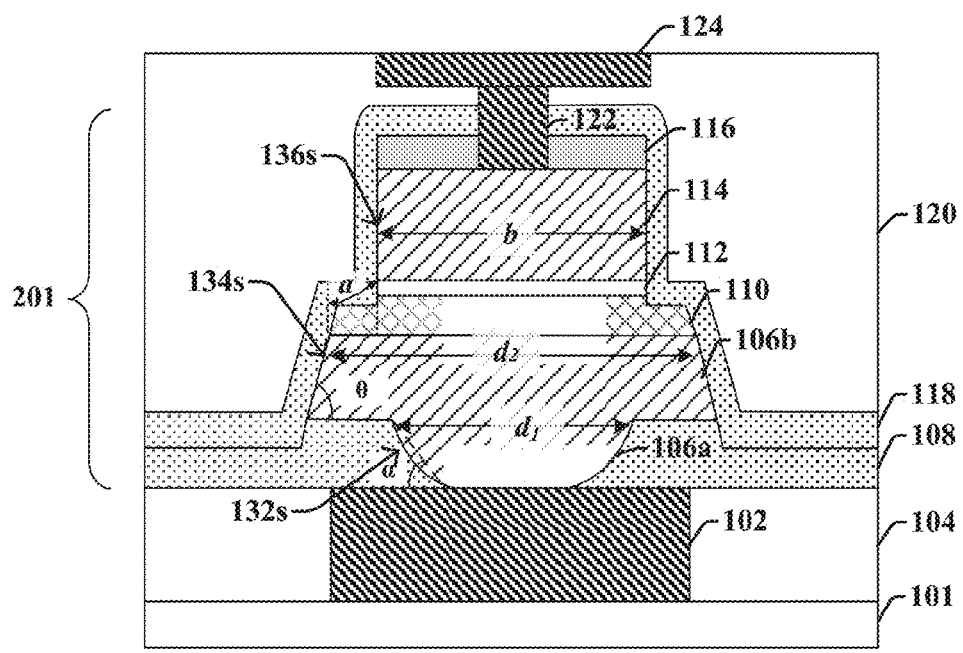
FIGS. 2A-2B illustrates cross-sectional views of some additional embodiments of an integrated circuit device including a RRAM cell.

FIG. 2A illustrates a cross-sectional view of an integrated circuit device 200a including a RRAM cell 201 according to some additional embodiments.

The integrated circuit device 200a comprises a bottom electrode 106 arranged over a lower metal interconnect layer 102 surrounded by a bottom ILD layer 104. The bottom electrode 106 comprises an upper portion 106b and a lower portion 106a. The bottom electrode 106 may comprise titanium (Ti), tantalum (Ta), titanium nitride (TiN), tantalum nitride (TaN) or one or more layers of other metal composite films. In some embodiments, the bottom electrode 106 may comprise at least two layers of conductive materials. In some embodiments, a diffusion barrier layer (not shown) is disposed between the bottom electrode 106 and the underlying lower metal interconnect layer 102 to prevent contamination and damage to the bottom electrode 106 introduced by diffusion between the lower metal interconnect layer 102 and the bottom electrode 106. In some embodiments, the diffusion barrier layer may comprise, for example, Ta or TaN or a conductive oxide, nitride, or oxynitride of a selected metal A sidewall 134s of the upper portion 106b of the bottom electrode 106 can be tilted with a first tilt angle θ. In some embodiments, the first tilt angle θ is in a range of from about 65° to about 75° with respect to a lower surface of the upper portion 106b of the bottom electrode 106. A sidewall 132s of the lower portion 106a of the bottom electrode 106 can be curved, either concave or convex, with a second tilt angle α between a plane shown as dashed-line from a top edge to a bottom edge of the lower portion 106a and a lateral lower surface of the lower portion 106a of the bottom electrode 106. The tilt angle α can be smaller than 90°, more specifically, around 45° with respect to the lateral surface plane or around 60° to 70° with respect to the first tilt angle θ.

The bottom electrode 106 has a peripheral portion that is not vertically covered by the narrower top electrode 114. The peripheral portion of the bottom electrode 106 extends past the narrower top electrode to provides for a leakage path distance a (i.e., a distance through which a leakage current will travel, also known as isolation distance) that extends between edges of the bottom electrode 106 and the top electrode 114. In some embodiments, a ratio of the leakage path distance a to a lateral dimension b of the top electrode is in a range of from about 1:7 to about 1:13.

In some embodiments, the lower portion 106a of the bottom electrode 106 may have a relatively small width $d_1$ compared to a width $d_2$ of the upper portion 106b. The lower portion 106a can act as a via to be electrically coupled to the underlying lower metal interconnect layer 102. An inverted triangular shape of the bottom electrode 106 and filament shape conductive path build therein during operation of the RRAM cell 201 improves data retention and endurance performance of the RRAM cell 201. In some embodiments, the relatively small width $d_1$ can be a minimal dimension allowed by a manufacturing process. In some other embodiments, $d_1$ can be smaller than the photolithography dimension limitation of an associated manufacturing process.

Figure 2B:
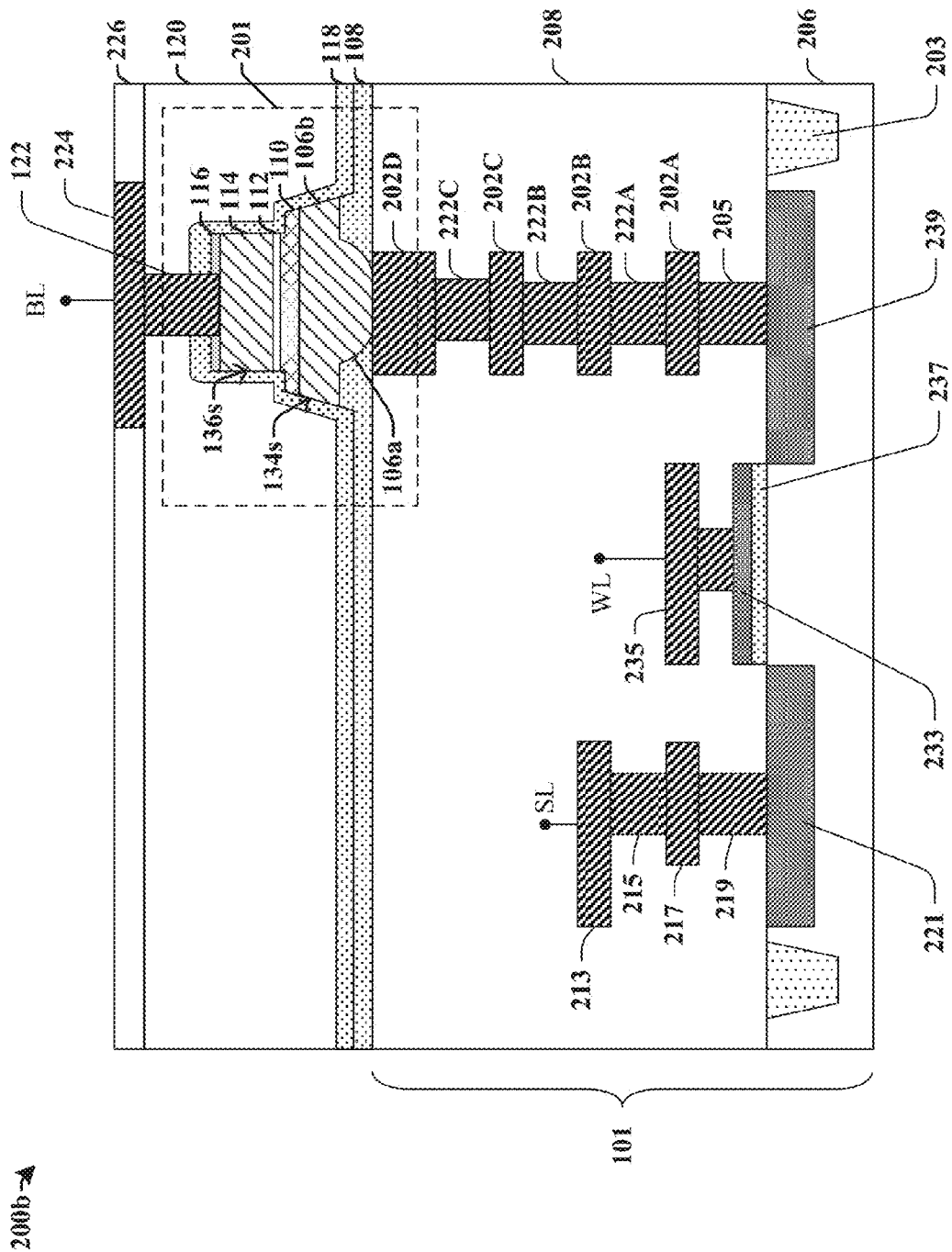

FIG. 2B illustrates a cross-sectional view of an integrated circuit device 200b including RRAM cell 201.

As shown in FIG. 2B, the RRAM cell 201 can be disposed over a substrate 101 comprising a semiconductor substrate 206 having a transistor arranged between isolation regions 203. The transistor includes a source region 221, a drain region 239, a gate electrode 233, and a gate dielectric 237. A source line 213 (SL) for operating the RRAM cell 201 is formed in a second metal interconnect layer 213 and is connected to source region 221 through a contact plug 219, a first metal interconnect line 217, and a first metal via 215, which are disposed within one or more ILD layers 208. A word line 235 (WL) for addressing the RRAM cell 201 is formed in the first metal interconnect layer 235 and contacts gate electrode 233. The bottom electrode 106 of the RRAM cell 201 is connected to the drain region 239 through contact plug 205, first, second, third, and forth metal interconnect layers 202A-202D, and metal vias 222A-222C formed between the metal interconnect layers 202A-202D. An upper metal via 122 connects a top electrode 114 of the RRAM cell 201 to a bit line 224 formed within a fifth metal interconnect layer disposed within ILD layer 226.

In most embodiments, the integrated circuit device 200b uses a 1T1R (one transistor, one resistor) RRAM device structure as shown in FIG. 2B. However, it will be appreciated that in other embodiments the RRAM cell 201 can be applied with other RRAM device structures (e.g., a 2T2R). Also, source line 213, word line 235, and bit line 224 can be located in different layers than shown in this example.

Figure 3:
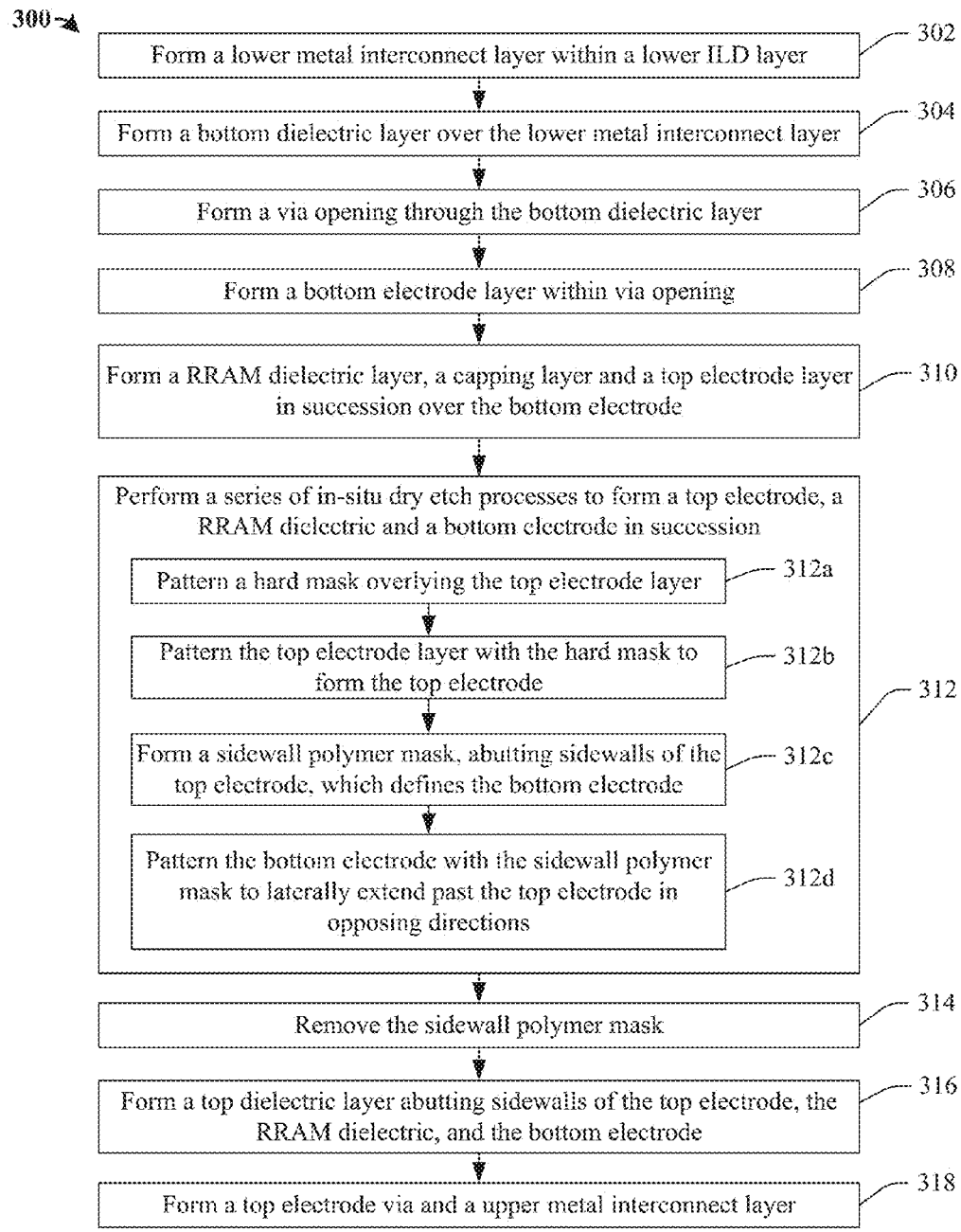
FIG. 3 illustrates a flow diagram of some embodiments of a method of forming an integrated circuit device including a RRAM cell.

FIG. 3 illustrates a flow diagram of some embodiments of a method 300 of forming an integrated circuit device including a RRAM cell.

While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a lower metal interconnect layer is formed within a lower ILD layer.

At 304, a bottom dielectric layer is formed over the lower metal interconnect layer and the lower ILD layer.

At 306, a via opening is formed through the bottom dielectric layer to a position overlying the lower metal interconnect layer.

At 308, a bottom electrode layer is formed within via opening. The bottom electrode layer may be formed by depositing one or more conductive layers followed by a planarization process such as chemical-mechanical polishing.

At 310, a RRAM dielectric layer, a capping layer and a top electrode layer are formed in succession over the bottom electrode.

At 312, a series of in-situ dry etching processes are performed to form a stack comprising a top electrode, a RRAM dielectric and a bottom electrode. In some embodiments, the series of in-situ dry etch processes may be performed according to acts 312a-312d, as described below.

At 312a, a hard mask is patterned overlying the top electrode layer.

At 312b, the top electrode layer in patterned with the hard mask to form the top electrode.

At 312c, a sidewall polymer mask is formed, abutting sidewalls of the top electrode, which defines the bottom electrode.

At 312d, the bottom electrode is patterned with the sidewall polymer mask to laterally extend past the top electrode in opposing directions.

At 314, the sidewall polymer mask is removed.

At 316, a top dielectric layer is formed abutting sidewalls of the top electrode, the RRAM dielectric, and the bottom electrode.

At 318, an upper metal via and an upper interconnect metal layer are formed over the top dielectric layer within an upper ILD layer. The upper metal via is disposed through the top dielectric layer and connected to the top electrode.

FIGS. 4-14 illustrate some embodiments of cross-sectional views showing a method of forming an integrated circuit device including a RRAM cell. Although FIGS. 4-14 are described in relation to method 300, it will be appreciated that the structures disclosed in FIGS. 4-14 are not limited to such a method, but instead may stand alone as structures independent of the method.

Figure 4:
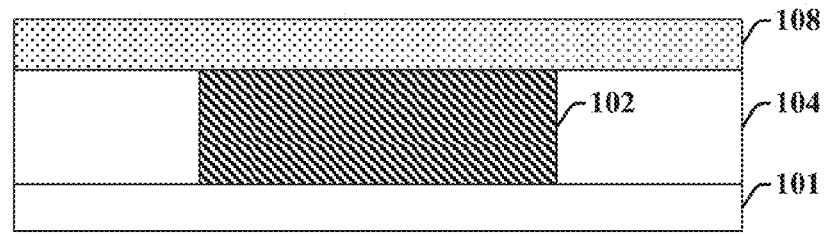
FIGS. 4-14 illustrate cross-sectional views of some embodiments showing manufacturing processes of a method of forming a method of forming an integrated circuit device including a RRAM cell.

FIG. 4 illustrates some embodiments of a cross-sectional view 400 corresponding to acts 302 and 304.

As shown in cross-sectional view 400, a lower metal interconnect layer 102 is formed within a lower ILD layer 104 overlying a substrate 101. In some embodiments, the lower metal interconnect layer 102 may be disposed within a BEOL stack (as shown in FIG. 2, which illustrates the lower metal interconnect layer 102 formed within the forth interconnect metal layer M4). A bottom dielectric layer 108 is formed over the lower metal interconnect layer 102 and the lower ILD layer 104. In some embodiments, the bottom dielectric layer 108 may comprise silicon-nitride (SiN), silicon-carbide (SiC), or a similar composite dielectric film. In some embodiments, the bottom dielectric layer 108 may be formed by a vapor deposition technique (e.g., physical vapor deposition, chemical vapor deposition, etc.). In some embodiments, the lower metal interconnect layer 102 may be formed by selectively etching the lower ILD layer 104 (e.g., an oxide, a low-k dielectric, or an ultra low-k dielectric) to form an opening in the lower ILD layer 104. A metal (e.g., copper, aluminum, etc.) is then deposited to fill the opening, and a planarization process is performed to remove excess metal to form the lower metal interconnect layer 102.

Figure 5:
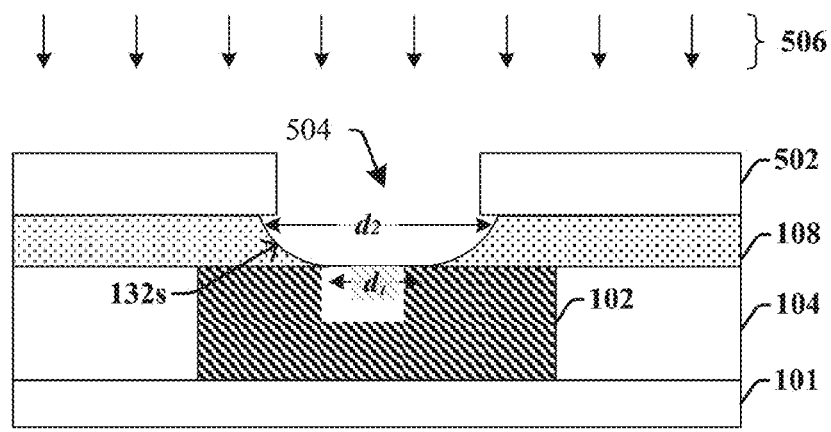

FIG. 5 illustrates some embodiments of a cross-sectional view 500 corresponding to act 306.

As shown in cross-sectional view 500, a via opening 504 is formed through the bottom dielectric layer 108 at a position overlying the lower metal interconnect layer 102. In some embodiments, a photoresist mask 502 is firstly formed over the bottom dielectric layer 108 with an opening corresponding to the via opening 504 to be formed. Then the work piece is exposed to an etchant 506 that removes an exposed portion of the bottom dielectric layer 108. In some embodiments, the via opening 504 can be formed through a dry etch process such as a plasma etching. By adjusting powers and flow rate of react gases used in the plasma etching, contours of the via opening 504 can be controlled. In some embodiments, a tapered sidewall 132s is formed to facilitate subsequent reliable filling of the via opening 504 with a conductive material. As an example, a tilt angle of around 45° with respect to a lateral plane is formed herein. The via opening 504 may have a lateral dimension $d_1$ closer to the lower metal interconnect layer 102 that is smaller than a lateral dimension $d_2$ further from the lower metal interconnect layer 102.

Figure 6:
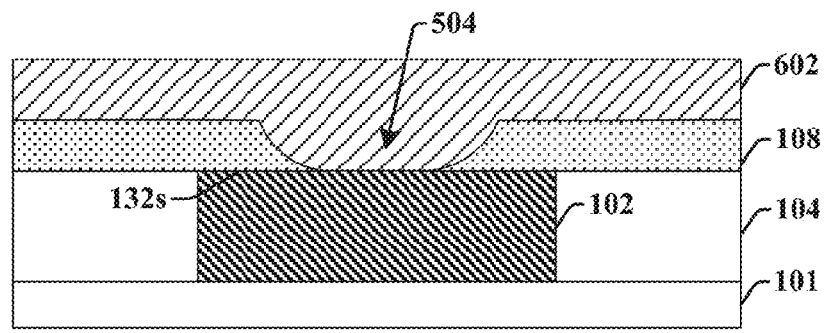

FIG. 6 illustrates some embodiments of a cross-sectional view 600 corresponding to act 308.

As shown in cross-sectional view 600, the photoresist mask 502 is removed and a bottom electrode layer 602 is formed within the via opening 504 and extending over the bottom dielectric layer 108. A diffusion barrier layer (not shown) may be deposited on the lower metal interconnect layer 102 and the sidewall 312s of the via opening prior to deposition of the bottom electrode layer 602 to prevent diffusion between the lower metal interconnect layer 102 and the bottom electrode layer 602. The bottom electrode layer 602 may be formed by depositing one or more conductive layers followed by a planarization process such as chemical-mechanical polishing. In various embodiments, the bottom electrode layer 602 may comprise a metal nitride (e.g., titanium nitride (TiN) or tantalum nitride (TaN) or a metal (e.g., titanium (Ti) or tantalum (Ta)).

Figure 7:
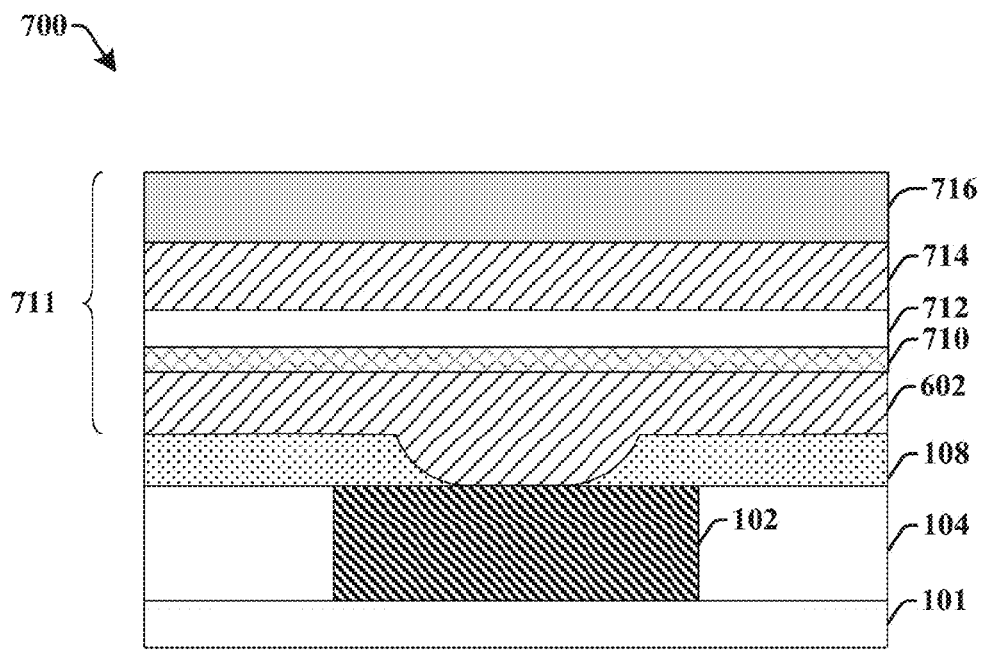

FIG. 7 illustrates some embodiments of a cross-sectional view 700 corresponding to act 310.

As shown in cross-sectional view 700, a RRAM dielectric layer 710, an optional capping layer 712, a top electrode layer 714, and a hard mask layer 716 are formed in succession over the bottom electrode layer 602 to form an un-patterned RRAM stack 711.

In some embodiments, the hard mask layer 716 may comprise oxygen containing dielectric, such as silicon-oxide ($SiO_2$) or silicon-oxynitride (SiON). In other embodiments, the hard mask layer 716 may comprise a hard mask layer that is substantially devoid of oxygen, such as silicon-nitride (SiN) silicon-carbide (SiC), or a composite dielectric film that is substantially devoid of oxygen. In some embodiments, the RRAM dielectric layer 710 may comprise a high-k dielectric material having a variable resistance. For example, in some embodiments, the RRAM dielectric layer 710 may comprise metal oxidation composite such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state. In some embodiments, the capping layer 712 may comprise a metal or its oxidation composite also depending on its resistance state; examples are titanium (Ti), hafnium (Hf), zirconium (Zr), germanium (Ge) or cesium (Ce). In some embodiments, the top electrode layer 714 may comprise a metal nitride (e.g., titanium nitride (TiN) or tantalum nitride (TaN) or a metal (e.g., titanium (Ti) or tantalum (Ta)).

FIGS. 8-11 illustrate some embodiments of cross-sectional views 800, 900, 1000 and 1100 corresponding to act 312 (e.g., cross-sectional views 800, 900, 1000 and 1100 correspond to act 312a, 312b, 312c, and 312d, respectively). FIGS. 8-11 show a series of dry etch processes to form a stack comprising a top electrode, a RRAM dielectric and a bottom electrode in succession. In some embodiments, the dry etch processes can be performed in-situ, in other words, within a same reactant chamber held under vacuum to avoid contamination or oxidation. In such embodiments, different reactive conditions can be applied for the series of dry etch processes. By performing the dry etch processes in-situ, the bottom electrode and the top electrode are formed within a single processing step (i.e., a process performed without removing a workpiece from a reactant chamber), which can reduce processing costs in comparison to manufacturing procedures in which the top and bottom electrodes are patterned separately and interrupted by sidewall spacer deposition.

As shown in cross-sectional view 800 corresponding to act 312a, a hard mask 116 is patterned from the hard mask layer 716 of FIG. 7, overlying the top electrode layer 714. The hard mask layer 716 may be selectively exposed to an etchant 802a in areas not covered by a corresponding photoresist mask 804. In some embodiments, the etchant 802a comprises an etching chemistry comprising gases of $CF_4$, $CH_2F_2$ and/or other chemicals. The photoresist mask 804 is removed after the formation of the hard mask 116 to prevent introducing contamination to the subsequent processes. In some embodiments, the photoresist mask 804 can be removed by adding oxygen to the etchant 802a.

Figure 8:
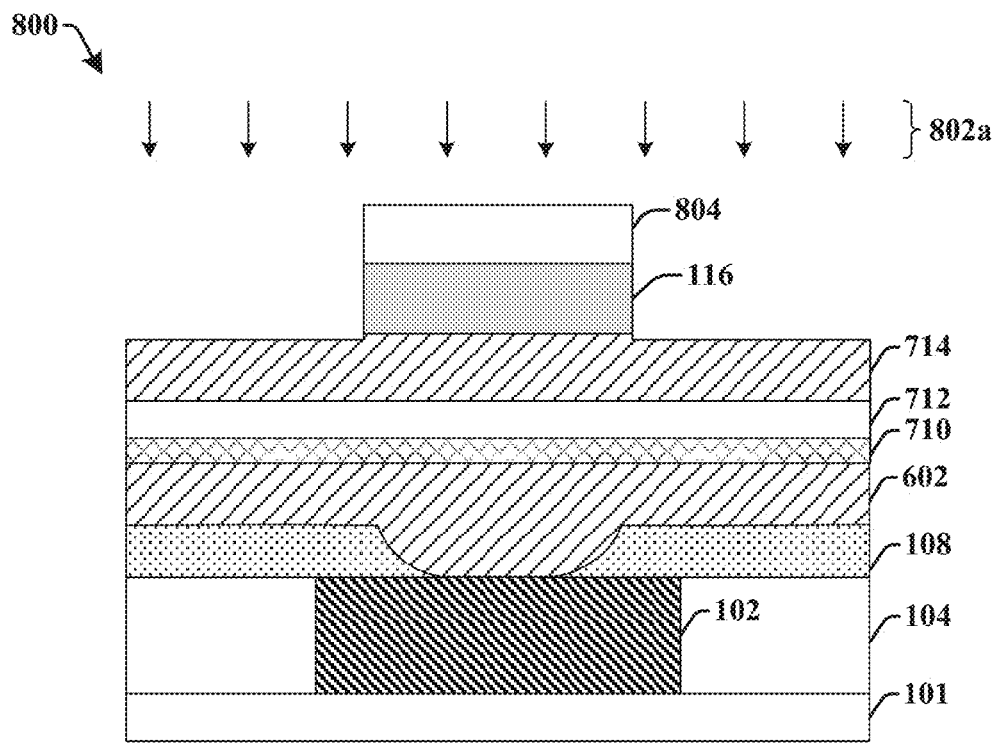
Figure 9:
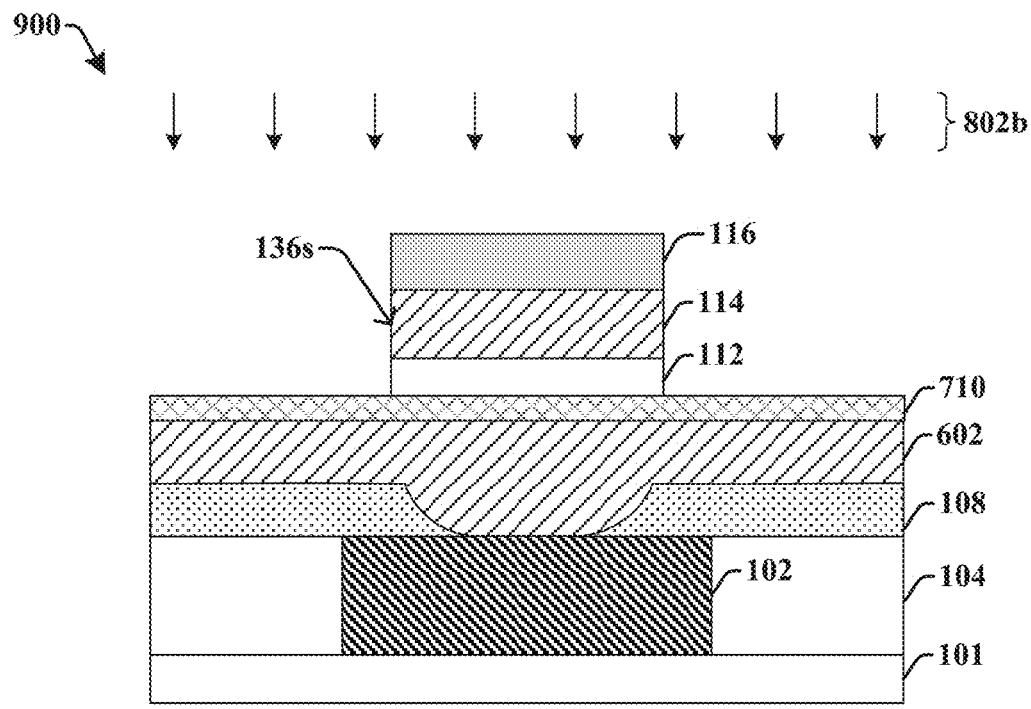

As shown in cross-sectional view 900 corresponding to act 312b, a top electrode 114 is patterned from the top electrode layer 714 of FIG. 8 with the hard mask 116 in place. In some embodiments, an etchant 802b, is applied to etch an exposed portion of the top electrode layer 714 and the optional capping layer 712 that is not covered by the hard mask 116 (referring to FIG. 8). Thus, sidewalls of the formed hard mask 116, the top electrode 114, and the capping layer 112 are vertically aligned. The RRAM dielectric layer 710 acts as an etch stop layer to the etchant 802b with a lower etch rate relative to the top electrode layer 714 and the optional capping layer 712. In some embodiments, the etchant 802b may comprise a dry etchant having an etching chemistry comprising gases of $CH_2F_2$, $Cl_2$, $BCl_3$ and/or other chemicals.

As shown in cross-sectional view 1000 corresponding to act 312c, a sidewall polymer mask 1002 is formed along the sidewalls of the hard mask 116, the top electrode 114, and the capping layer 112. In some embodiments, an etchant 802c is applied to facilitate deposition of the sidewall polymer mask 1002. In some embodiments, the etchant 802c may comprise a dry etchant having an etching chemistry comprising gases of hydrogen bromide (HBr) and $N_2$ and/or other chemicals. In some embodiments, the sidewall polymer mask 1002 comprises a composite of chemicals of the RRAM dielectric layer 710 and the etchant 802c. For example, the sidewall polymer mask could comprise a composite of HfO and HBr, if HfO is used as the RRAM dielectric material and HBr is applied as one of the react gases of the etchant 802c. Some additional reactant gases such as $CH_2F_2$, $Cl_2$, $BCl_3$ are also applied as elements of the etchant 802c, configured to etch the RRAM dielectric layer 710. Ratios of reactant gases can be adjusted to control an etch rate, a deposition rate, a final thickness, and/or a width of the sidewall polymer mask 1002.

Figure 10:
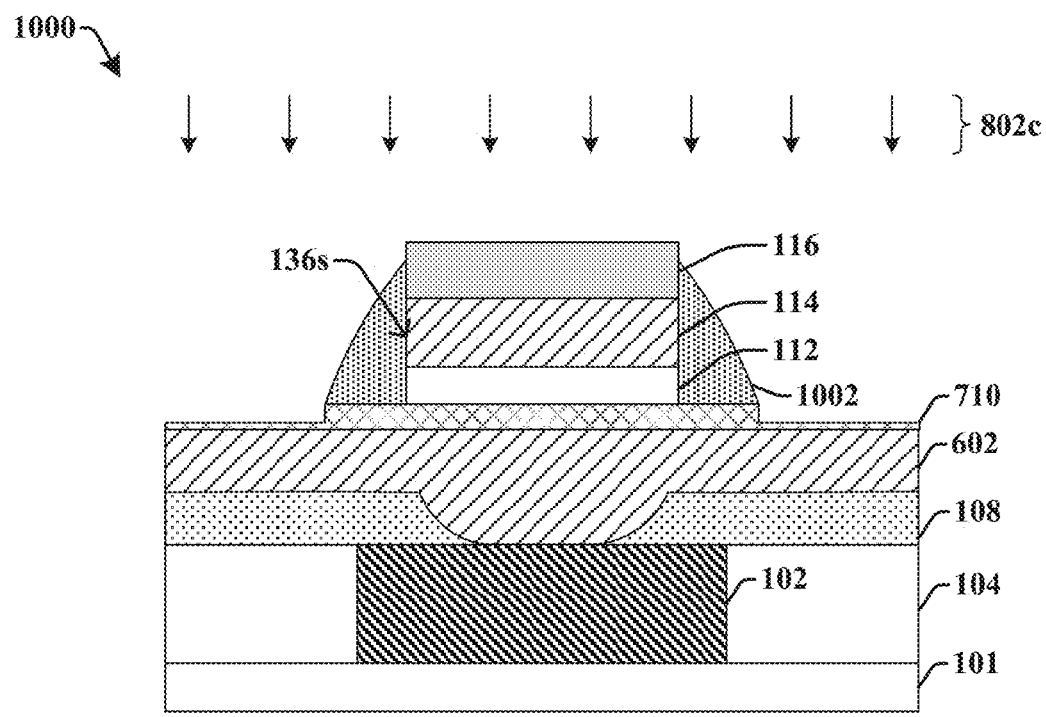
Figure 11:
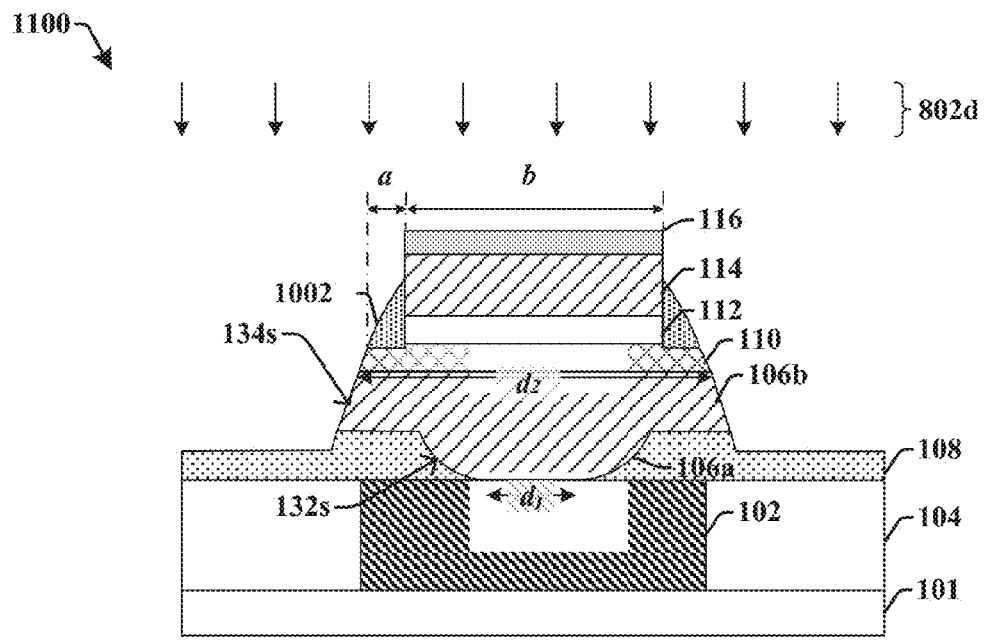

As shown in cross-sectional view 1100 corresponding to act 312d, the bottom electrode 106 is patterned from the bottom electrode layer 602 of FIG. 10 according to the sidewall polymer mask 1002. In some embodiments, an etchant 802d is applied to etch a remaining portion of the RRAM dielectric layer 710 and an exposed portion of the bottom electrode layer 602 that is not covered by the sidewall polymer mask 1002 (referring to FIG. 10). In some embodiments, the etchant 802c may comprise a dry etchant having an etching chemistry comprising flow gases of $CH_2F_2$, $Cl_2$, $BCl_3$ and/or other chemicals. The bottom electrode is formed with an upper portion 106b having a width $d_2$ that is larger than a width $d_1$ of a lower portion 106a. The bottom electrode 106 laterally extends past the top electrode 114 by a distance "a" in opposing directions with the sidewall polymer mask 1002 covered thereover. The top electrode 114 has a width "b". In some embodiments, a ratio of "a" to "b" is in a range of 1:7 to 1:13. As an example for non-limiting purpose, in a 40 nm node process, isolation distance "a" could be around 15 nm-20 nm when cell dimension "b" is 150 nm. The bottom dielectric layer 108 acts as an etch stop layer to the etchant 802d with a lower etch rate relative to the bottom electrode layer 602.

Figure 12:
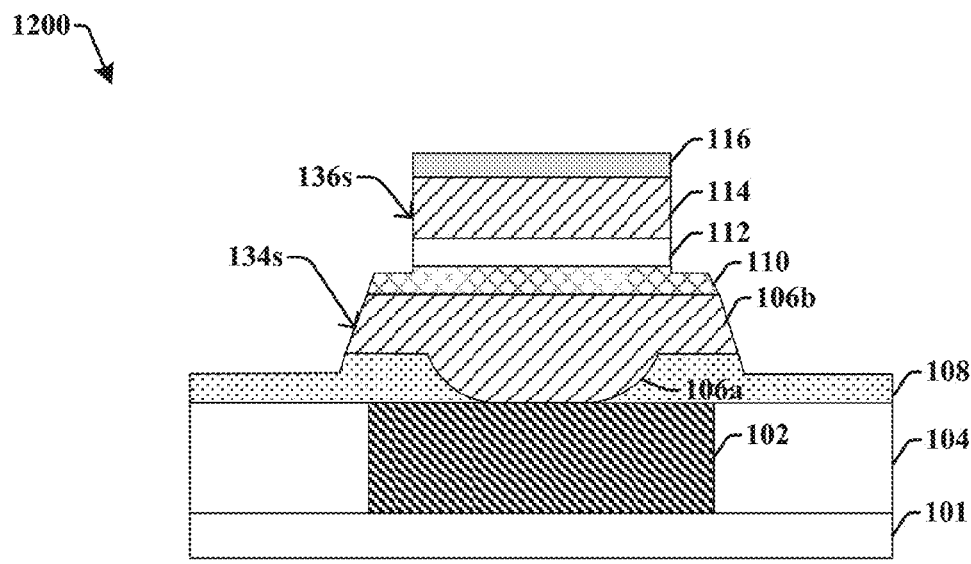

FIG. 12 illustrates some embodiments of a cross-sectional view 1200 corresponding to act 314.

As shown in cross-sectional view 1200, the sidewall polymer mask 1002 is removed. In some embodiments, the sidewall polymer mask 1002 is removed by a wet stripping process.

Figure 13:
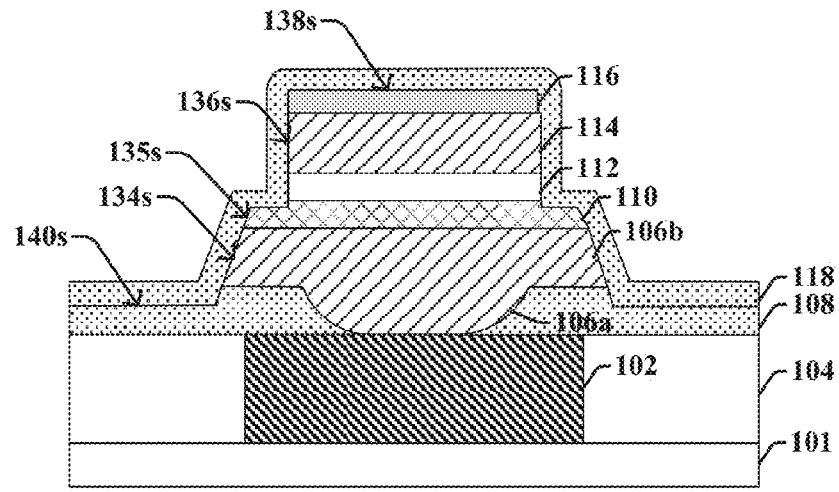

FIG. 13 illustrates some embodiments of a cross-sectional view 1300 corresponding to act 316.

As shown in cross-sectional view 1300, a conformal top dielectric layer 118 is formed to overlie an upper surface 140s of the bottom dielectric layer 108 and to extend along exposed sidewalls 134s, 135s, 135s of the upper portion 106b of the bottom electrode, the RRAM dielectric 110, and the top electrode 114, and overlying an upper surface 138s of the hard mask 116.

Figure 14:
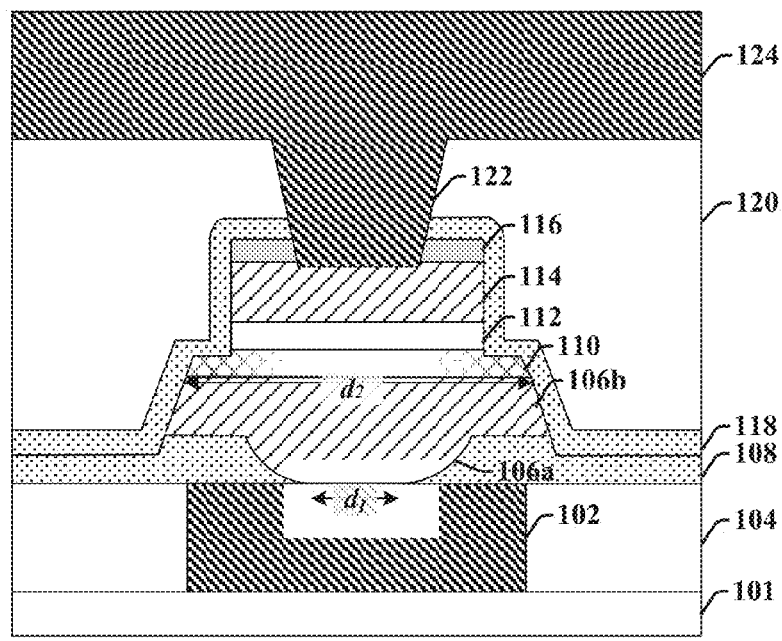

FIG. 14 illustrates some embodiments of a cross-sectional view 1400 corresponding to act 318.

As shown in cross-sectional view 1400, an upper metal via 122 and an upper metal interconnect layer 124 are formed over the top dielectric layer 118 within an upper ILD layer 120. The upper metal via 122 is disposed through the top dielectric layer 118 and connected to the top electrode 114.

Therefore, the present disclosure relates to an integrated circuits device having a RRAM cell, and an associated method of formation. The RRAM cell of the integrated circuits comprises a bottom electrode and a top electrode separated by a RRAM dielectric. The bottom electrode comprises a lower portion and a wider upper portion. The upper portion of the bottom electrode is patterned in a process chamber by a sidewall polymer mask that can be formed beforehand in the same process chamber. The top electrode can also be patterned in the same process chamber prior to the formation of the sidewall polymer mask.

In some embodiments, the present disclosure relates to integrated circuit device. The integrated circuit device comprises a lower metal interconnect layer surrounded by a lower inter-level dielectric (ILD) layer. The integrated circuit device further comprises a bottom electrode disposed over the lower metal interconnect layer. The bottom electrode comprises a lower portion surrounded by a bottom dielectric layer and an upper portion that is wider than the lower portion. The bottom dielectric layer is disposed over the lower metal interconnect layer and the lower ILD layer. The integrated circuit device further comprises a RRAM dielectric having a variable resistance, disposed on the bottom electrode and a top electrode disposed over the RRAM dielectric. The integrated circuit device further comprises a top dielectric layer disposed over the bottom dielectric layer abutting sidewalls of the upper portion of the bottom electrode, the RRAM dielectric, and the top electrode and overlying a top surface of the top electrode.

In some other embodiments, the present disclosure relates to an integrated circuit device comprises a substrate comprising a transistor with source and drain regions, a lower metal interconnect layer disposed over the substrate, a resistive random access memory (RRAM) cell disposed over the lower metal interconnect layer and an upper metal interconnect layer disposed over the RRAM cell. The lower metal interconnect layer is electrically coupled to the drain region of the transistor through a series of contacts and vias and the upper metal interconnect layer is electrically coupled to the top electrode of the RRAM cell through a via. The RRAM cell comprises a bottom electrode, a RRAM dielectric arranged over the bottom electrode, and a top electrode arranged over the RRAM dielectric. The bottom electrode comprises an upper portion with a trapezoid shape and a lower portion with a smaller lateral dimension than the upper portion. The top electrode has a cuboid shape with a lateral dimension smaller than a minimum lateral dimension of the upper portion of the bottom electrode.

In yet other embodiments, the present disclosure relates to a method of an integrated circuit device. The method comprises forming a bottom electrode layer over a substrate, a RRAM dielectric layer over the bottom electrode layer, and a top electrode layer over the bottom electrode layer. The method further comprises patterning the top electrode layer to form a top electrode. The method further comprises etching the RRAM dielectric layer and depositing a sidewall polymer mask along a sidewall of the top electrode. The method further comprises patterning the bottom electrode layer according to the sidewall polymer mask to form a bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a lower metal interconnect layer surrounded by a lower inter-level dielectric (ILD) layer;
   a bottom electrode disposed over the lower metal interconnect layer and comprising a lower portion surrounded by a bottom dielectric layer and an upper portion that is wider than the lower portion, wherein the bottom dielectric layer is disposed over the lower metal interconnect layer and the lower ILD layer;
   a RRAM dielectric having a variable resistance, disposed on the bottom electrode;
   a top electrode disposed over the RRAM dielectric; and
   a top dielectric layer disposed over the bottom dielectric layer abutting sidewalls of the upper portion of the bottom electrode, the RRAM dielectric, and the top electrode and overlying a top surface of the top electrode.

2. The integrated circuit device of claim 1, wherein the upper portion of the bottom electrode has a tapered sidewall covered by the top dielectric layer, and the tapered sidewall has a first tilt angle in a range of from about 65° to about 75° with respect to a lower surface of the upper portion.

3. The integrated circuit device of claim 2, wherein the lower portion of the bottom electrode is tapered with a second tilt angle of about 60° to about 70° with respect to the first tilt angle.

4. The integrated circuit device of claim 2, wherein a sidewall of the RRAM dielectric is aligned with the tapered sidewall of the upper portion of the bottom electrode.

5. The integrated circuit device of claim 1, wherein the bottom dielectric layer abuts the lower portion of the bottom electrode and the top dielectric layer abuts the upper portion of the bottom electrode, the RRAM dielectric, and the top electrode.

6. The integrated circuit device of claim 1, wherein a ratio of an isolation distance between the top and bottom electrodes to a lateral dimension of the top electrode is in a range of from about 1:7 to about 1:13.

7. The integrated circuit device of claim 1, wherein the bottom electrode comprises at least two layers of conductive material including titanium (Ti), tantalum (Ta), titanium nitride (TiN), or tantalum nitride (TaN).

8. The integrated circuit device of claim 1, wherein the RRAM dielectric comprises one or more of hafnium aluminum oxide (HfAlO), hafnium oxide (HfO$_x$), aluminum oxide (AlO$_x$), or tantalum oxide (TaO$_x$).

9. The integrated circuit device of claim 1, wherein the top and bottom dielectric layers comprises silicon carbide (SiC).

10. The integrated circuit device of claim 1, further comprising:
a capping layer disposed between the RRAM dielectric and the top electrode, having a sidewall vertically aligned with a sidewall of the top electrode, wherein the capping layer has a lower concentration of oxygen than the RRAM dielectric; and
a hard mask disposed between the top electrode and the top dielectric layer and having a sidewall vertically aligned with sidewalls of the capping layer and the RRAM dielectric.

11. The integrated circuit device of claim 10, wherein the capping layer comprises titanium (Ti), hafnium (Hf), platinum (Pt), or ruthenium (Ru).

12. An integrated circuit device, comprising:
a substrate comprising a transistor with a source region and a drain region;
a lower metal interconnect layer disposed over the substrate and electrically coupled to the drain region of the transistor through a series of contacts and vias;
a resistive random access memory (RRAM) cell disposed over the lower metal interconnect layer and comprising a bottom electrode, a RRAM dielectric arranged over the bottom electrode, and a top electrode arranged over the RRAM dielectric; and
an upper metal interconnect layer disposed over the RRAM cell and electrically coupled to the top electrode of the RRAM cell through a via;
wherein the bottom electrode comprises an upper portion with a trapezoid shape and a lower portion with a smaller lateral dimension than the upper portion;
wherein the top electrode has a cuboid shape with a lateral dimension smaller than a minimum lateral dimension of the upper portion of the bottom electrode.

13. The integrated circuit device of claim 12, further comprising:
a bottom dielectric layer having a curved sidewall that abuts a corresponding curved sidewall of the lower portion of the bottom electrode; and
a top dielectric layer disposed over the bottom dielectric layer and continuously extending along tapered sidewalls of the upper portion of the bottom electrode and the RRAM dielectric, wherein the top dielectric layer overlies a top surface of the RRAM dielectric not covered by the top electrode, and extends along a sidewall of the top electrode and overlies a top surface of the top electrode.

14. The integrated circuit device of claim 13, wherein a tilt angle of the tapered sidewalls of the upper portion of the bottom electrode and the RRAM dielectric is in a range of from about 65° to about 75°.

15. The integrated circuit device of claim 12, wherein a ratio of an isolation distance between the top and bottom electrodes to a lateral dimension of the top electrode is in a range of from about 1:7 to about 1:13.

16. A method of forming an integrated circuit device, comprising:
forming a bottom electrode layer over a substrate, a RRAM dielectric layer over the bottom electrode layer, and a top electrode layer over the RRAM dielectric layer;
patterning the top electrode layer to form a top electrode;
depositing a sidewall polymer mask along a sidewall of the top electrode; and
patterning the bottom electrode layer according to the sidewall polymer mask to form a bottom electrode having a sidewall that is inwardly tilted;
wherein the bottom electrode is formed by forming a via opening through a bottom dielectric layer followed by forming the bottom electrode layer into the via opening and over the bottom dielectric layer, such that the bottom electrode is formed to comprise a lower portion surrounded by the bottom dielectric layer and an upper portion that is wider than the lower portion.

17. The method of claim 16, wherein the RRAM dielectric layer is etched concurrent to depositing the sidewall polymer mask by using hydrogen bromide (HBr) and one or more additional reactant gases.

18. The method of claim 16, wherein patterning the top electrode layer, depositing the sidewall polymer mask, and patterning the bottom electrode layer, are performed in-situ.

19. The method of claim 16, wherein the sidewall polymer mask is partially etched concurrent to patterning the bottom electrode layer.

20. The method of claim 16, wherein the bottom electrode layer is formed to include a lower portion and an upper portion that is wider than the lower portion.

* * * * *